US007045882B2

(12) United States Patent
Paek

(10) Patent No.: US 7,045,882 B2
(45) Date of Patent: May 16, 2006

(54) SEMICONDUCTOR PACKAGE INCLUDING FLIP CHIP

(75) Inventor: Jong Sik Paek, Kwangju-shi (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/944,314

(22) Filed: Sep. 17, 2004

(65) Prior Publication Data

US 2005/0029636 A1 Feb. 10, 2005

Related U.S. Application Data

(63) Continuation of application No. 10/034,656, filed on Dec. 26, 2001, now Pat. No. 6,803,645.

(30) Foreign Application Priority Data

Dec. 29, 2000 (KR) ................ 2000-86246

(51) Int. Cl.
*H01L 23/495* (2006.01)
(52) U.S. Cl. .................. 257/666; 257/778; 257/787
(58) Field of Classification Search ............... 257/666, 257/673, 698, 777–780, 784, 786, 787, 788, 257/795
See application file for complete search history.

(56) References Cited

U.S. PATENT DOCUMENTS

| | | | |
|---|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |

(Continued)

FOREIGN PATENT DOCUMENTS

DE    19734794 A1    8/1997

(Continued)

*Primary Examiner*—Hung Vu
(74) *Attorney, Agent, or Firm*—Stetina Brunda Garred & Brucker

(57) ABSTRACT

A semiconductor package comprising a plurality of leads. Each of the leads defines opposed first and second surfaces. Also included in the semiconductor package is a semiconductor chip which defines opposed first and second surfaces, and includes a plurality of input/output pads disposed on the first surface thereof. A plurality of conductive bumps are used to electrically connect the input/output pads of the semiconductor package to the second surfaces of respective ones of the leads. An encapsulant portion of the semiconductor package covers the semiconductor chip, the conductive bumps, and the second surfaces of the leads such that at least portions of the first surfaces of the leads are exposed within the encapsulant portion.

20 Claims, 2 Drawing Sheets

U.S. PATENT DOCUMENTS

| | | |
|---|---|---|
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A * | 2/1999 | Shin et al. .................. 257/666 |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A * | 10/1999 | Baba et al. .................. 257/778 |
| 5,973,388 A | 10/1999 | Chew et al. |

| | | | |
|---|---|---|---|
| 5,976,912 A | 11/1999 | Fukutomi et al. | |
| 5,977,613 A | 11/1999 | Takata et al. | |
| 5,977,615 A | 11/1999 | Yamaguchi et al. | |
| 5,977,630 A | 11/1999 | Woodworth et al. | |
| 5,981,314 A | 11/1999 | Glenn et al. | |
| 5,986,333 A | 11/1999 | Nakamura | |
| 5,986,885 A | 11/1999 | Wyland | |
| 6,001,671 A | 12/1999 | Fjelstad | |
| 6,013,947 A | 1/2000 | Lim | |
| 6,018,189 A | 1/2000 | Mizuno | |
| 6,020,625 A | 2/2000 | Qin et al. | |
| 6,025,640 A | 2/2000 | Yagi et al. | |
| 6,031,279 A | 2/2000 | Lenz | |
| RE36,613 E | 3/2000 | Ball | |
| 6,034,423 A | 3/2000 | Mostafazadeh et al. | |
| 6,040,626 A | 3/2000 | Cheah et al. | |
| 6,043,430 A | 3/2000 | Chun | |
| 6,060,768 A | 5/2000 | Hayashida et al. | |
| 6,060,769 A | 5/2000 | Wark | |
| 6,072,228 A | 6/2000 | Hinkle et al. | |
| 6,075,284 A | 6/2000 | Choi et al. | |
| 6,081,029 A | 6/2000 | Yamaguchi | |
| 6,084,310 A | 7/2000 | Mizuno et al. | |
| 6,087,715 A | 7/2000 | Sawada et al. | |
| 6,087,722 A | 7/2000 | Lee et al. | |
| 6,100,594 A | 8/2000 | Fukui et al. | |
| 6,113,473 A | 9/2000 | Costantini et al. | |
| 6,114,752 A | 9/2000 | Huang et al. | |
| 6,118,174 A | 9/2000 | Kim | |
| 6,118,184 A | 9/2000 | Ishio et al. | |
| RE36,907 E | 10/2000 | Templeton, Jr. et al. | |
| 6,130,115 A | 10/2000 | Okumura et al. | |
| 6,130,473 A | 10/2000 | Mostafazadeh et al. | |
| 6,133,623 A | 10/2000 | Otsuki et al. | |
| 6,140,154 A | 10/2000 | Hinkle et al. | |
| 6,143,981 A | 11/2000 | Glenn | |
| 6,169,329 B1 | 1/2001 | Farnworth et al. | |
| 6,177,718 B1 | 1/2001 | Kozono | |
| 6,181,002 B1 | 1/2001 | Juso et al. | |
| 6,184,465 B1 | 2/2001 | Corisis | |
| 6,184,573 B1 | 2/2001 | Pu | |
| 6,194,777 B1 | 2/2001 | Abbott et al. | |
| 6,197,615 B1 | 3/2001 | Song et al. | |
| 6,198,171 B1 | 3/2001 | Huang et al. | |
| 6,201,186 B1 | 3/2001 | Daniels et al. | |
| 6,201,292 B1 | 3/2001 | Yagi et al. | |
| 6,204,554 B1 | 3/2001 | Ewer et al. | |
| 6,208,020 B1 | 3/2001 | Minamio et al. | |
| 6,208,021 B1 | 3/2001 | Ohuchi et al. | |
| 6,208,023 B1 | 3/2001 | Nakayama et al. | |
| 6,211,462 B1 | 4/2001 | Carter, Jr. et al. | |
| 6,218,731 B1 | 4/2001 | Huang et al. | |
| 6,222,258 B1 | 4/2001 | Asano et al. | |
| 6,222,259 B1 | 4/2001 | Park et al. | |
| 6,225,146 B1 | 5/2001 | Yamaguchi et al. | |
| 6,229,200 B1 | 5/2001 | Mclellan et al. | |
| 6,229,205 B1 | 5/2001 | Jeong et al. | |
| 6,239,367 B1 | 5/2001 | Hsuan et al. | |
| 6,239,384 B1 | 5/2001 | Smith et al. | |
| 6,242,281 B1 | 6/2001 | Mclellan et al. | |
| 6,256,200 B1 | 7/2001 | Lam et al. | |
| 6,258,629 B1 | 7/2001 | Niones et al. | |
| 6,281,566 B1 | 8/2001 | Magni | |
| 6,281,568 B1 | 8/2001 | Glenn et al. | |
| 6,282,095 B1 | 8/2001 | Houghton et al. | |
| 6,285,075 B1 | 9/2001 | Combs et al. | |
| 6,291,271 B1 | 9/2001 | Lee et al. | |
| 6,291,273 B1 | 9/2001 | Miyaki et al. | |
| 6,294,100 B1 | 9/2001 | Fan et al. | |
| 6,294,830 B1 | 9/2001 | Fjelstad | |
| 6,295,977 B1 | 10/2001 | Ripper et al. | |
| 6,297,548 B1 | 10/2001 | Moden et al. | |
| 6,303,984 B1 | 10/2001 | Corisis | |
| 6,303,997 B1 | 10/2001 | Lee | |
| 6,307,272 B1 | 10/2001 | Takahashi et al. | |
| 6,309,909 B1 | 10/2001 | Ohgiyama | |
| 6,316,822 B1 | 11/2001 | Venkateshwaran et al. | |
| 6,316,838 B1 | 11/2001 | Ozawa et al. | |
| 6,323,550 B1 | 11/2001 | Martin et al. | |
| 6,326,243 B1 | 12/2001 | Suzuya et al. | |
| 6,326,244 B1 | 12/2001 | Brooks et al. | |
| 6,326,678 B1 | 12/2001 | Karmezos et al. | |
| 6,335,564 B1 | 1/2002 | Pour | |
| 6,337,510 B1 | 1/2002 | Chun-Jen et al. | |
| 6,339,255 B1 | 1/2002 | Shin | |
| 6,348,726 B1 | 2/2002 | Bayan et al. | |
| 6,355,502 B1 | 3/2002 | Kang et al. | |
| 6,369,447 B1 | 4/2002 | Mori | |
| 6,369,454 B1 | 4/2002 | Chung | |
| 6,373,127 B1 | 4/2002 | Baudouin et al. | |
| 6,380,048 B1 | 4/2002 | Boon et al. | |
| 6,384,472 B1 | 5/2002 | Huang | |
| 6,388,336 B1 | 5/2002 | Venkateshwaran et al. | |
| 6,395,578 B1 | 5/2002 | Shin et al. | |
| 6,400,004 B1 | 6/2002 | Fan et al. | |
| 6,410,979 B1 | 6/2002 | Abe | |
| 6,414,385 B1 | 7/2002 | Huang et al. | |
| 6,420,779 B1 | 7/2002 | Sharma et al. | |
| 6,429,508 B1 | 8/2002 | Gang | |
| 6,437,429 B1 | 8/2002 | Su et al. | |
| 6,444,499 B1 | 9/2002 | Swiss et al. | |
| 6,448,633 B1 | 9/2002 | Yee et al. | |
| 6,452,279 B1 | 9/2002 | Shimoda | |
| 6,459,148 B1 | 10/2002 | Chun-Jen et al. | |
| 6,464,121 B1 | 10/2002 | Reijnders | |
| 6,476,469 B1 | 11/2002 | Huang et al. | |
| 6,476,474 B1 | 11/2002 | Hung | |
| 6,482,680 B1 | 11/2002 | Khor et al. | |
| 6,498,099 B1 | 12/2002 | McLellan et al. | |
| 6,498,392 B1 | 12/2002 | Azuma | |
| 6,507,096 B1 | 1/2003 | Gang | |
| 6,507,120 B1 | 1/2003 | Lo et al. | |
| 6,534,849 B1 | 3/2003 | Gang | |
| 6,545,332 B1 | 4/2003 | Huang | |
| 6,545,345 B1 | 4/2003 | Glenn et al. | |
| 6,559,525 B1 | 5/2003 | Huang | |
| 6,566,168 B1 | 5/2003 | Gang | |
| 6,583,503 B1 | 6/2003 | Akram et al. | |
| 6,603,196 B1 | 8/2003 | Lee et al. | |
| 6,624,005 B1 | 9/2003 | Di Caprio et al. | |
| 6,667,546 B1 | 12/2003 | Huang et al. | |
| 2001/0008305 A1 | 7/2001 | McLellan et al. | |
| 2001/0014538 A1 | 8/2001 | Kwan et al. | |
| 2002/0011654 A1 | 1/2002 | Kimura | |
| 2002/0024122 A1 | 2/2002 | Jung et al. | |
| 2002/0027297 A1 | 3/2002 | Ikenaga et al. | |
| 2002/0140061 A1 | 10/2002 | Lee | |
| 2002/0140068 A1 | 10/2002 | Lee et al. | |
| 2002/0163015 A1 | 11/2002 | Lee et al. | |
| 2003/0030131 A1 | 2/2003 | Lee et al. | |
| 2003/0073265 A1 | 4/2003 | Hu et al. | |
| 2004/0056277 A1 | 3/2004 | Karnezos | |
| 2004/0061212 A1 | 4/2004 | Karnezos | |
| 2004/0061213 A1 | 4/2004 | Karnezos | |
| 2004/0063242 A1 | 4/2004 | Karnezos | |
| 2004/0063246 A1 | 4/2004 | Karnezos | |
| 2004/0065963 A1 | 4/2004 | Karnezos | |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |

| | | | | | | |
|---|---|---|---|---|---|---|
| EP | 093667.1 | 8/1999 | | JP | 5283460 | 10/1993 |
| EP | 098968 | 3/2000 | | JP | 692076 | 4/1994 |
| EP | 1032037 | 8/2000 | | JP | 6140563 | 5/1994 |
| JP | 55163868 | 12/1980 | | JP | 6260532 | 9/1994 |
| JP | 5745959 | 3/1982 | | JP | 7297344 | 11/1995 |
| JP | 58160095 | 8/1983 | | JP | 7312405 | 11/1995 |
| JP | 59208756 | 11/1984 | | JP | 864634 | 3/1996 |
| JP | 59227143 | 12/1984 | | JP | 8083877 | 3/1996 |
| JP | 60010756 | 1/1985 | | JP | 8125066 | 5/1996 |
| JP | 60116239 | 8/1985 | | JP | 96-4284 | 6/1996 |
| JP | 60195957 | 10/1985 | | JP | 8222682 | 8/1996 |
| JP | 60231349 | 11/1985 | | JP | 8306853 | 11/1996 |
| JP | 6139555 | 2/1986 | | JP | 98205 | 1/1997 |
| JP | 629639 | 1/1987 | | JP | 98206 | 1/1997 |
| JP | 6333854 | 2/1988 | | JP | 98207 | 1/1997 |
| JP | 63067762 | 3/1988 | | JP | 992775 | 4/1997 |
| JP | 63188964 | 8/1988 | | JP | 9293822 | 11/1997 |
| JP | 63205935 | 8/1988 | | JP | 10022447 | 1/1998 |
| JP | 63233555 | 9/1988 | | JP | 10163401 | 6/1998 |
| JP | 63249345 | 10/1988 | | JP | 10199934 | 7/1998 |
| JP | 63289951 | 11/1988 | | JP | 10256240 | 9/1998 |
| JP | 63316470 | 12/1988 | | JP | 00150765 | 5/2000 |
| JP | 64054749 | 3/1989 | | JP | 556398 | 10/2000 |
| JP | 1106456 | 4/1989 | | JP | 2001060648 | 3/2001 |
| JP | 1175250 | 7/1989 | | JP | 200204397 | 8/2002 |
| JP | 1205544 | 8/1989 | | KR | 941979 | 1/1994 |
| JP | 1251747 | 10/1989 | | KR | 9772358 | 11/1997 |
| JP | 2129948 | 5/1990 | | KR | 100220154 | 6/1999 |
| JP | 369248 | 7/1991 | | KR | 0049944 | 6/2002 |
| JP | 3177060 | 8/1991 | | WO | 9956316 | 11/1999 |
| JP | 4098864 | 9/1992 | | WO | 9967821 | 12/1999 |
| JP | 5129473 | 5/1993 | | | | |
| JP | 5166992 | 7/1993 | | * cited by examiner | | |

SEMICONDUCTOR PACKAGE INCLUDING FLIP CHIP

RELATED APPLICATION

The present application is a continuation of U.S. application Ser. No. 10/034,656 entitled SEMICONDUCTOR PACKAGE INCLUDING FLIP CHIP filed Dec. 26, 2001 now U.S. Pat. No. 6,803,645.

CROSS-REFERENCE TO RELATED APPLICATIONS

The present application claims priority to Korean Patent Application No. 2000-86246 entitled SEMICONDUCTOR PACKAGE filed Dec. 29, 2000.

STATEMENT RE: FEDERALLY SPONSORED RESEARCH/DEVELOPMENT (Not Applicable)

BACKGROUND OF THE INVENTION

1. Field of the Invention

The present invention relates generally to semiconductor packages, and more particularly to a semiconductor package which includes a flip chip and is specifically configured to provide a thinner profile and superior moisture resistance capabilities as compared to flip chip semiconductor packages known in the prior art.

2. Description of the Related Art

The recent trend in the electronics industry has been toward the fabrication of lighter, thinner, more simplistic and miniaturized semiconductor packages. To achieve these objectives, there has been developed semiconductor packages fabricated through the use of a flip chip bonding method wherein a semiconductor chip is electrically connected to a printed circuit board component of the package. In this flip chip bonding method, the semiconductor chip is bonded to predetermined regions of the printed circuit board component through a reflow process subsequent to the orientation of an active surface of the semiconductor chip toward the printed circuit board component. The flip chip bonding method is used as an alternative to a conventional wire bonding method wherein conductive wires are used to facilitate the electrical connection of the input and output pads of a die to a lead frame.

However, currently known semiconductor packages fabricated using the flip chip bonding method described above possess certain deficiencies which detract from their overall utility. More particularly, since such semiconductor package employs a printed circuit board component which is costly, the manufacturing cost of the entire semiconductor package is itself significantly increased. In this regard, the cost of the printed circuit board component is extremely high due to the complexity of its manufacturing process, with the printed circuit board component accounting for more than sixty percent of the total cost of the semiconductor package employing the same. As indicated above, this high cost of the printed circuit board component results in an increased cost in the semiconductor package.

Another drawback associated with the printed circuit board component is that the same typically includes a resin layer and a solder mask which each have high water absorptivity. The susceptibility of the resin layer and solder mask to high levels of water absorption causes the semiconductor package to have a low level of resistance to moisture. As a result, the life span of the semiconductor package is drastically shortened when the same is used in regions of high humidity. A further problem pertains to the conductive balls which are fused to the bottom surface of the printed circuit board component of the semiconductor package. In this regard, the conductive balls are typically thicker than the semiconductor package itself, thus resulting in a significant increase in the overall thickness of the semiconductor package assembly including the conductive balls. The present invention overcomes these and other deficiencies of prior art semiconductor packages fabricated through the use of a flip chip bonding method, as will be discussed in more detail below.

BRIEF SUMMARY OF THE INVENTION

In accordance with the present invention, there is provided a semiconductor package comprising a lead frame which includes a plurality of leads. Each of the leads defines opposed, generally planar first and second surfaces. Each of the leads is preferably half-etched so as to further define a third surface which is formed between the first and second surfaces thereof. The semiconductor package also includes a semiconductor chip which defines opposed first and second surfaces, and includes a plurality of input/output pads disposed on the first surface thereof. The input/output pads of the semiconductor chip are electrically connected to the second surfaces of respective ones of the leads via a plurality of conductive bumps. Formed on a prescribed region of the second surface of each lead is a bump land to which the corresponding conductive bump is preferably fused. Additionally, preferably applied to the entirety of the second surface of each lead with the exception of that portion or region thereof defining the bump land is a protective layer. In the semiconductor package, the semiconductor chip, the conductive bumps, and the second and third surfaces of the leads are covered by a hardened encapsulant portion. The first surfaces of the leads are exposed within the encapsulant portion so as to define input/output terminals of the semiconductor package.

The structural attributes of the present semiconductor package impart thereto the ability to withstand severe environments for prolonged durations of time. In this regard, the structure of the present semiconductor package provides substantial moisture resistance characteristics. In addition, the input/output terminals defined by the exposed first surfaces of the leads can be mounted directly to an external device such as a motherboard, thereby minimizing the thickness of the semiconductor package/motherboard assembly. The configuration of the lead frame used in the manufacture of the present semiconductor package further minimizes the cost associated with the fabrication thereof.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
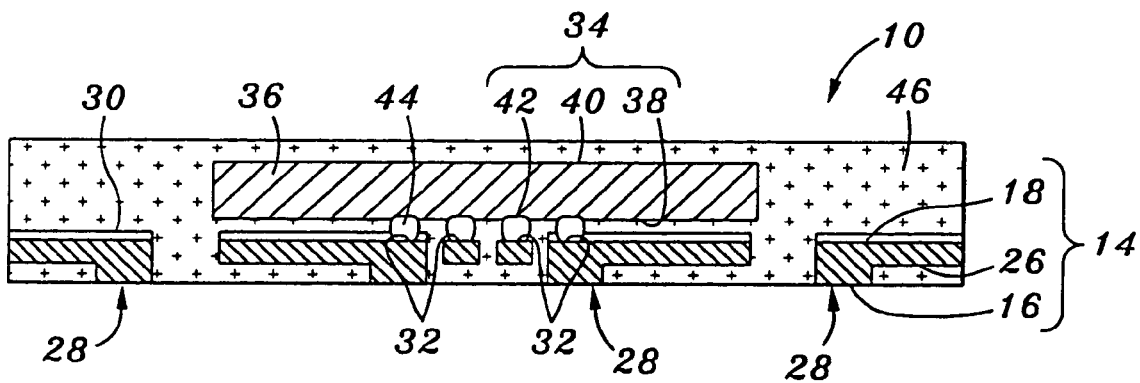
FIG. 1 is a cross-sectional view of a semiconductor package constructed in accordance with the present invention.
Figure 2:
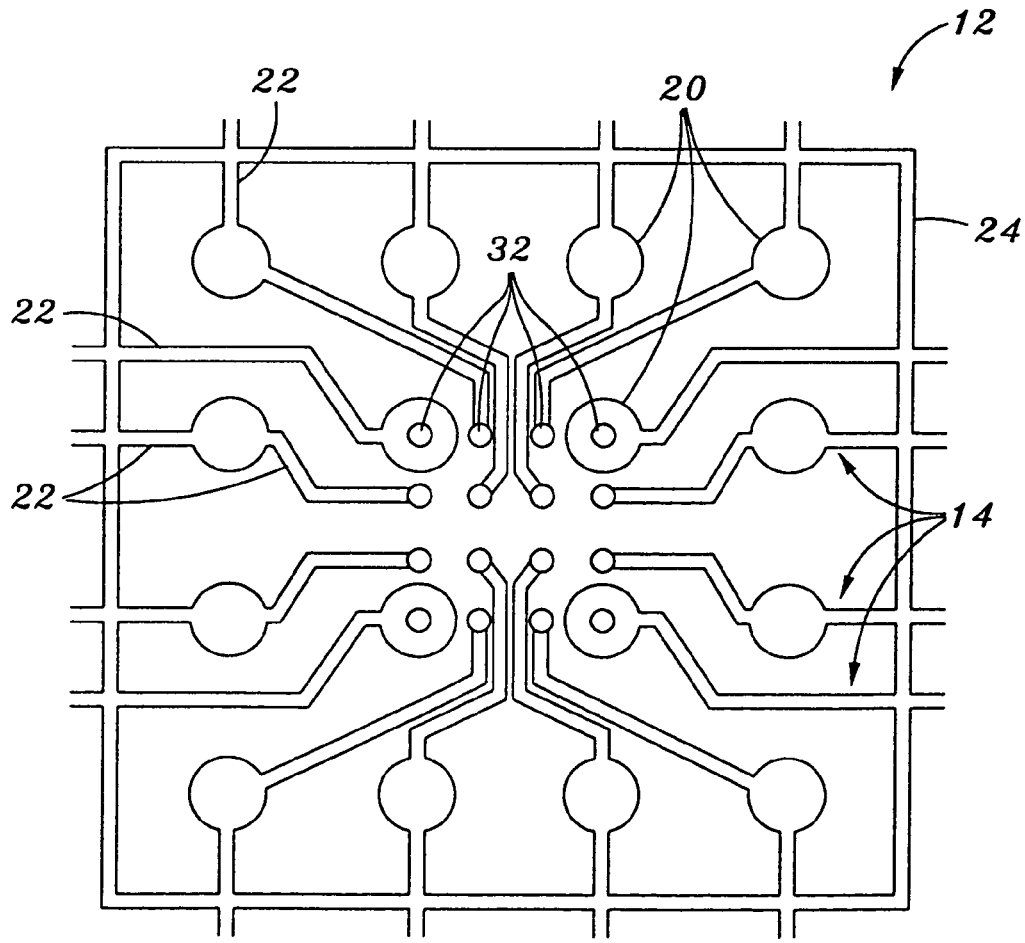
FIG. 2 is a top plan view of the lead frame included in the semiconductor package shown in FIG. 1.

Referring now to the drawings wherein the showings are for purposes of illustrating a preferred embodiment of the present invention only, and not for purposes of limiting the same, FIG. 1 illustrates in cross section a semiconductor package 10 constructed in accordance with the present invention. The semiconductor package 10 includes a lead frame 12 which is shown in FIG. 2. The lead frame 12 includes a plurality of leads 14, each of which defines a generally planar first (bottom) surface 16 and an opposed, generally planar second (top) surface 18. Each of the leads 14 further defines a circularly configured pad portion 20 and at least one elongate connecting bar portion 22 integrally connected to and extending from the pad portion 20. The leads 14 are arranged within the lead frame 12 such that the pad portions 20 are segregated into an outer set of twelve pad portions 20 which are arranged in a generally square pattern and an inner set of four pad portions 20 which are located within the outer set and also arranged in a generally square pattern. The pad portions 20 of the outer set each include a pair of connecting bar portions 22 extending therefrom, with one of the connecting bar portions 22 extending to a dambar 24 of the lead frame 12. The pad portions 20 of the inner set include only a single connecting bar portion 22 extending therefrom which also extends and is integrally connected to the dambar 24. As will be recognized, the dambar 24 is used to support the leads 14 within the lead frame 12 and, as is apparent from FIG. 1, is removed during the process of fabricating the semiconductor package 10. Those of ordinary skill in the art will recognize that the lead frame 12 may be fabricated to include greater or fewer than twelve leads 14, which also may be arranged in alternative patterns.

Figure 3A:
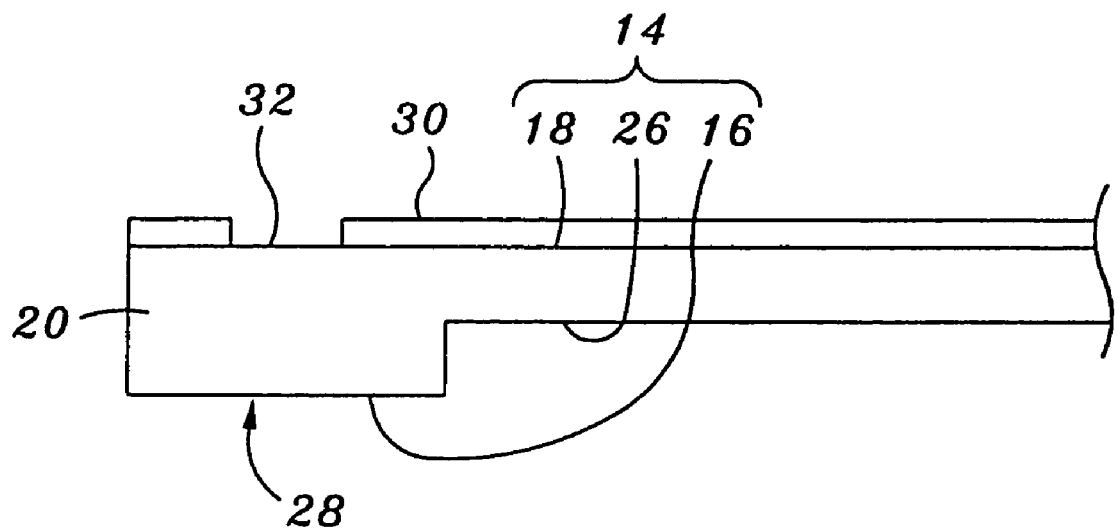
FIG. 3A is a side-elevational view of a portion of the lead frame shown in FIG. 2.
Figure 3B:
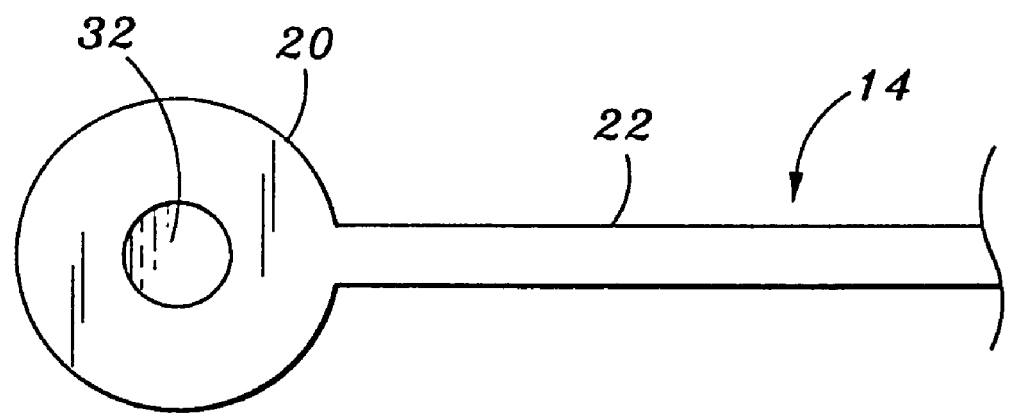
FIG. 3B is a top plan view of a portion of the lead frame shown in FIG. 2.

In the semiconductor package 10 of the present invention, the leads 14 are not of uniform thickness. Rather, each of the leads 14 is formed to include a third surface 26 which is perpendicularly offset from the first surface 16. Thus, the third surface 26 extends along a plane which is disposed between, and is generally parallel to, the planes along which the first and second surfaces 16, 18 extend. As best seen in FIGS. 1 and 3A, the third surfaces 26 of the leads 14 are preferably disposed in opposed relation to those sections or portions of the second surfaces 18 which extend along the connecting bar portions 22. Thus, the connecting bar portions 22 of the leads 14 are of a reduced thickness relative to the pad portions 20 thereof. The third surfaces 26 of the leads 14 may be formed by chemically half-etching the lead frame 12, or through the use of alternative methods. The half-etching will occur on those portions of the first surfaces 16 extending along the connecting bar portions 22, and not those portions extending along the pad portions 20. As further seen in FIG. 3A, those non-etched portions of the first surfaces 16 extending along the pad portions 20 each define an output terminal 28 of the semiconductor package 10. The lead frame 12 (and hence the leads 14) is preferably fabricated from copper, iron, or a copper alloy, as is generally known in the art.

Referring now to FIGS. 1, 2, 3A and 3B, the second surface 18 of each lead 14 preferably includes a protective layer 30 of a predetermined thickness formed thereon. Additionally, included on the second surface 18 of each lead 14 of the inner set in the approximate center of the pad portion 20 thereof is a bump land 32. A bump land 32 is also formed on each second surface 18 at the innermost end of the connecting bar portion 22 extending from a respective one of the pad portions 20 of the outer set. Thus, as seen in FIG. 2, a total of sixteen bump lands 32 are included on the lead frame 12 and arranged in a four-by-four matrix, the corners of which are defined by the bump lands 32 included on the pad portions 20 of the inner set.

The semiconductor package 10 of the present invention further comprises a semiconductor chip 34 (i.e., a flip chip). The semiconductor chip 34 comprises a body 36 defining a generally planar first (bottom) surface 38 and an opposed, generally planar second (top) surface 40. Formed on the first surface 38 are a plurality of input/output pads 42. Each of the input/output pads 42 is electrically connected to a respective one of the bump lands 32 by a conductive bump 44. Each conductive bump 44 is preferably fabricated by a conductive material such as gold, silver, solder, or their equivalents. As shown in FIGS. 1 and 2, the bump lands 32 included on the pad portions 20 of the inner set are in direct alignment with the input/output terminals 28 defined by the pad portions 20 of the inner set. As a result, their may be difficulty in fusing the conductive bumps 44 to the bump lands 32 included on the pad portions 20 of the inner set attributable to an excessive size of such bump lands 32. For this reason, the protective layer 30 is included on the second surface 18 of each lead 14, with the protective layer 30 being formed to be of a predetermined thickness and to maintain a predetermined region of each bump land 32 in a substantially circular configuration. That is, the protective layer 30 serves to prevent each conductive bump 44 from excessively overflowing along the second surface 18 of each lead 14. The protective layer 30 may be formed on the second surface 18 of each lead 14 at only the vicinity of the corresponding bump land 32, or may be formed to cover the entire second surface 18 of each lead 14 except at the corresponding bump land 32. The protective layer 30 may be fabricated from a conductive or non-conductive material such as aluminum, titanium, or polyimide. However, those of ordinary skill in the art will recognize that the protective layer 30 is not intended to be limited to any particular material.

As further seen in FIG. 1, in the semiconductor package 10 of the present invention, the semiconductor chip 34, the conductive bumps 44, and the leads 14 (with the exception of those portions of the first surfaces 16 defining the input/output terminals 28 and the outermost ends of certain connecting bar portions 22) are covered or encapsulated by an encapsulant 46 in order to protect the same from the external environment. The encapsulant 46 may be any one of an epoxy molding compound, a liquified glop top or its equivalent, with the present invention not being limited to any particular material. In the semiconductor package 10, the third surfaces 26 of the leads 14 are covered by and thus located within the hardened encapsulant 46. As a result, the third surfaces 26 serve to strengthen the adhesion of the encapsulant 46 to the covered or encapsulated components/surfaces of the semiconductor package 10, and prevent movement of the leads 14 within the encapsulant 46 or separation of the leads 14 therefrom. As indicated above, those portions of the first surfaces 16 of the leads 14 defining the input/output terminals 28 are exposed within the bottom surface of the hardened encapsulant 46 in order to provide subsequent mounting or electrical connection of the semiconductor package 10 to an external device (not shown). The semiconductor package 10 of the present invention is adapted to withstand severe environments for a prolonged duration of time due to the high resistance thereof to moisture. In addition, the input/output terminals 28 can be directly mounted to an external device such as a motherboard, thus resulting in a reduction in the thickness of the semiconductor package 10.

This disclosure provides exemplary embodiments of the present invention. The scope of the present invention is not limited by these exemplary embodiments. Numerous variations, whether explicitly provided for by the specification or implied by the specification, such as variations in structure, dimension, type of material or manufacturing process may be implemented by one of skill in the art in view of this disclosure.

What is claimed is:

1. A semiconductor package comprising:
    a semiconductor chip defining opposed first and second surfaces and including a plurality of input/output pads disposed on the first surface thereof;
    a plurality of leads, each of the leads defining first and second surfaces and including:
        a pad portion; and
        at least one connecting bar portion integrally connected to and extending from the pad portion;
        at least some of the leads each having a bump land formed on the second surface upon the pad portion thereof and at least some of the leads each having a bump land formed on the second surface upon the connecting bar portion thereof; each of the bump lands being positioned underneath the second surface of the semiconductor chip, the number of the bump lands formed upon the connecting bar portions exceeding the number of the bump lands formed upon the pad portions;
    a plurality of conductive bumps electrically connecting the input/output pads to respective ones of the bump lands; and
    an encapsulant portion covering the semiconductor chip, the conductive bumps, and the second surfaces of the leads such that at least portions of the first surfaces of the leads are exposed in the encapsulant portion.

2. The semiconductor package of claim 1 wherein the first surface of the semiconductor chip is disposed at a prescribed separation distance from the second surfaces of the leads.

3. The semiconductor package of claim 1 wherein the bump lands are arranged in a generally quadrangular pattern.

4. The semiconductor package of claim 1 wherein the pad portion of each of the leads defines the first surface thereof which is exposed in the encapsulant portion.

5. The semiconductor package of claim 4 wherein at least some of the pad portions are not positioned underneath the second surface of the semiconductor chip.

6. The semiconductor package of claim 1 wherein:
    the first and second surfaces of each of the leads are generally planar and extend in opposed relation to each other;
    each of the leads further includes a third surface formed between the first and second surfaces thereof;
    the third surface of each of the leads is covered by the encapsulant portion; and
    the first surface of each of the leads is exposed within the encapsulant to serve as an input/output terminal.

7. The semiconductor package of claim 6 wherein the pad portion of each of the leads defines the first surface thereof which is exposed in the encapsulant portion.

8. The semiconductor package of claim 1 wherein each of the leads includes a protective layer formed on the second surface thereof other than for a prescribed region defining the bump land.

9. The semiconductor package of claim 1 wherein:
    the first and second surfaces of each of the leads are generally planar and extend in opposed relation to each other;
    each of the leads further includes a third surface formed between the first and second surfaces thereof in opposed relation to that segment of the second surface which extends along the connecting bar portion;
    the third surface of each of the leads is covered by the encapsulant portion; and
    the first surface of each of the leads extending along the pad portion thereof is exposed within the encapsulant portion to serve as an input/output terminal.

10. A semiconductor package comprising:
    a semiconductor chip defining opposed first and second surfaces and including a plurality of input/output pads disposed on the first surface thereof;
    a plurality of leads, each of the leads defining first and second surfaces and including:
        a pad portion; and
        at least one connecting bar portion integrally connected to and extending from the pad portion;
        at least some of the leads each having a bump land formed on the second surface upon the pad portion thereof and at least some of the leads each having a bump land formed on the second surface upon the connecting bar portion thereof, the pad portions including the bump lands each being positioned underneath the second surface of the semiconductor chip, the number of the bump lands formed on the second surfaces upon the connecting bar portions exceeding the number of the bump lands formed upon the pad portions;
    a plurality of conductive bumps electrically connecting the input/output pads to respective ones of the bump lands; and
    an encapsulant portion covering the semiconductor chip, the conductive bumps, and the second surfaces of the leads such that at least portions of the first surfaces of the leads are exposed within the encapsulant portion.

11. The semiconductor package of claim 10 wherein the first surface of the semiconductor chip is disposed at a prescribed separation distance from the second surfaces of the leads.

12. The semiconductor package of claim 10 wherein the pad portions including the bump lands are arranged in a generally quadrangular pattern.

13. The semiconductor package of claim 12 wherein the pad portions not including the bump lands are not positioned underneath the second surface of the semiconductor chip and are arranged in a generally quadrangular pattern.

14. The semiconductor package of claim 10 wherein the pad portion of each of the leads defines the first surface thereof which is exposed in the encapsulant portion.

15. The semiconductor package of claim 10 wherein:
    the first and second surfaces of each of the leads are generally planar and extend in opposed relation to each other;
    each of the leads further includes a third surface formed between the first and second surfaces thereof;

the third surface of each of the leads is covered by the encapsulant portion; and the first surface of each of the leads is exposed within the encapsulant to serve as an input/output terminal.

16. The semiconductor package of claim 15 wherein the pad portion of each of the leads defines the first surface thereof which is exposed in the encapsulant portion.

17. The semiconductor package of claim 10 wherein each of the leads includes a protective layer formed on the second surface thereof other than for a prescribed region defining the bump land.

18. The semiconductor package of claim 10 wherein:

the first and second surfaces of each of the leads are generally planar and extend in opposed relation to each other;

each of the leads further includes a third surface formed between the first and second surfaces thereof in opposed relation to that segment of the second surface which extends along the connecting bar portion;

the third surface of each of the leads is covered by the encapsulant portion; and the first surface of each of the leads extending along the pad portion thereof is exposed within the encapsulant portion to serve as an input/output terminal.

19. A semiconductor package comprising:

a semiconductor chip defining opposed first and second surfaces and including a plurality of input/output pads disposed on the first surface thereof;

a plurality of leads, each of the leads defining first and second surfaces and including:

a pad portion; and at least one connecting bar portion integrally connected to and extending from the pad portion;

at least some of the leads each having a bump land formed on the second surface upon the pad portion thereof and at least some of the leads each having a bump land formed on the second surface upon the connecting bar portion thereof, each of the bump lands being positioned underneath the second surface of the semiconductor chip;

a plurality of conductive bumps electrically connecting the input/output pads to respective ones of the bump lands; and an encapsulant portion covering the semiconductor chip, the conductive bumps, and the second surfaces of the leads such that at least portions of the first surfaces of the leads are exposed in the encapsulant portion;

the pad portion of each of the leads defining the first surface thereof which is exposed in the encapsulant portion, with at least some of the pad portions not being positioned underneath the second surface of the semiconductor chip.

20. A semiconductor package comprising:

a semiconductor chip defining opposed first and second surfaces and including a plurality of input/output pads disposed on the first surface thereof;

a plurality of leads, each of the leads defining first and second surfaces and including:

a pad portion; and at least one connecting bar portion integrally connected to and extending from the pad portion;

at least some of the leads each having a bump land formed on the second surface upon the pad portion thereof and at least some of the leads each having a bump land formed on the second surface upon the connecting bar portion thereof, the pad portions including the bump lands each being positioned underneath the second surface of the semiconductor chip;

a plurality of conductive bumps electrically connecting the input/output pads to respective ones of the bump lands; and an encapsulant portion covering the semiconductor chip, the conductive bumps, and the second surfaces of the leads such that at least portions of the first surfaces of the leads are exposed within the encapsulant portion;

the pad portions including the bump lands being arranged in a generally quadrangular pattern, with the pad portions not including the bump lands not being positioned underneath the second surface of the semiconductor chip and being arranged in a generally quadrangular pattern.

* * * * *